(12) United States Patent
Qin

(10) Patent No.: US 8,537,327 B2
(45) Date of Patent: Sep. 17, 2013

(54) ARRAY SUBSTRATE AND MANUFACTURING METHOD THEREOF, LIQUID CRYSTAL DISPLAY

(75) Inventor: Wei Qin, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 20 days.

(21) Appl. No.: 13/278,391

(22) Filed: Oct. 21, 2011

(65) Prior Publication Data

US 2012/0099058 A1   Apr. 26, 2012

(30) Foreign Application Priority Data

Oct. 22, 2010   (CN) .......................... 2010 1 0523192

(51) Int. Cl.
*G02F 1/13*   (2006.01)
*G02F 1/136*   (2006.01)

(52) U.S. Cl.
USPC ................................ 349/187; 349/42; 349/43

(58) Field of Classification Search
USPC ............................................ 349/42–43, 187
See application file for complete search history.

(56) References Cited

U.S. PATENT DOCUMENTS

| 2010/0012946 | A1 | 1/2010 | Zhi et al. | |
| 2010/0062556 | A1* | 3/2010 | Sasagawa et al. | 438/34 |
| 2010/0075450 | A1* | 3/2010 | Choi et al. | 438/30 |
| 2010/0075451 | A1* | 3/2010 | Yoo et al. | 438/34 |
| 2010/0093122 | A1* | 4/2010 | Min et al. | 438/30 |

FOREIGN PATENT DOCUMENTS

CN   101630098 A   1/2010

OTHER PUBLICATIONS

First Chinese Office Action dated May 6, 2013; Appln. No. 201010523192.6

* cited by examiner

*Primary Examiner* — Nathanael R Briggs
(74) *Attorney, Agent, or Firm* — Ladas & Parry LLP

(57) ABSTRACT

Embodiments of the disclosed technology relates to an array substrate, a manufacturing method thereof and a liquid crystal display. The method comprises: forming a gate metal film, applying photoresist on the gate metal film, patterning to form a gate line, a gate electrode and a gate line leading wire, and remain a part of photoresist on the gate line leading wire; sequentially depositing a gate insulating film, an active layer film and a source/drain metal film, applying photoresist on the source/drain metal film and patterning to form source/drain electrodes and a channel; lifting off the remained photoresist, the gate insulating film and the photoresist above the gate line leading wire; and then forming a protection layer and a pixel electrode.

12 Claims, 12 Drawing Sheets

B-B

C-C

D-D

E-E

C-C

D-D

E-E

C-C

D-D

E-E

C-C

D-D

ARRAY SUBSTRATE AND MANUFACTURING METHOD THEREOF, LIQUID CRYSTAL DISPLAY

BACKGROUND

Embodiments of the disclosed technology relate to an array substrate and a manufacturing method thereof and a liquid crystal display.

At present, liquid crystal displays are commonly used flat panel displays, and thin film transistor liquid crystal displays (TFT-LCDs) are the mainstream products of the liquid crystal displays.

A liquid crystal panel of a liquid crystal display generally comprises an array substrate and a color filter substrate. Typically, the array substrate comprises a base substrate on which a plurality of data lines and a plurality of gate lines intercrossing with each other are formed to define a plurality of pixel units arranged in matrix. Each of the pixel units comprises a TFT switch and a pixel electrode. The TFT switch comprises a gate electrode, a source electrode, a drain electrode and an active layer with the gate electrode connected with a corresponding gate line, the source electrode connected with a corresponding data line, the drain electrode connected with the pixel electrode, and the active layer being formed between the source/drain electrodes and the gate electrode. Generally, a common electrode line is further formed on the base substrate to supply a common voltage to the common electrode.

The conductive patterns on the array substrate are fabricated by a 5 mask or a 4 mask process. However, the 5 mask or 4 mask processes have disadvantages such as too many manufacturing procedures and high cost. Therefore, simplifying the manufacturing process is one of the research directions in the field of manufacturing liquid crystal display.

SUMMARY

A embodiment of the disclosed technology provides a manufacturing method for an array substrate, comprising: Step 1, forming a gate metal film on a base substrate, applying a layer of photoresist on the gate metal film, and exposing and developing the photoresist with a double tone mask, so as to form a photoresist pattern including a first thickness region, a second thickness region and a photoresist-completely-removed region, the photoresist pattern in the first thickness region being at least located above a gate region, the photoresist pattern in the second thickness region being located above the gate line leading wire region, and the first thickness is less than the second thickness; Step 2, etching so to remove the gate metal film corresponding to the photoresist-completely-removed region, and form a gate line, a gate electrode and a gate line leading wire; then ashing the photoresist so as to thin the photoresist by a thickness corresponding to the first thickness and remain a part of photoresist above the gate line leading wire region; Step 3, sequentially depositing a gate insulating film, an active layer film and a source/drain metal film on the base substrate after Step 2, applying a layer of photoresist on the source/drain metal film, and exposing and developing the photoresist with a double tone mask, so as to from a photoresist pattern including a third thickness region, a fourth thickness region and a photoresist-completely-removed region, the photoresist pattern in the third thickness region being at least located above a source/drain electrode region and a data line leading wire region, and the photoresist pattern in the fourth thickness region being located above a channel region, and the fourth thickness being less than the third thickness; Step 4, etching so as to remove completely the active layer film and the source/drain metal film corresponding to the photoresist-completely-removed region; ashing the photoresist so as to thin it by a thickness corresponding to the fourth thickness; and etching so as to etch the source/drain metal film and a part of the active layer film in the channel region, and form a TFT channel; and lifting off the remained photoresist pattern, and simultaneously lifting off the gate insulating film and the photoresist above the gate line leading wire region so as to expose the gate line leading wire; Step 5, forming a protection layer and a pixel electrode on the base substrate after Step 4 by a patterning process.

Another embodiment of the disclosed technology provides an array substrate, comprising: a base substrate; and conductive patterns and a pixel electrode formed on the base substrate, wherein, the conductive pattern at least comprises a gate line, a gate electrode, a data line, an active layer, a source electrode and a drain electrode, and the pixel electrode is connected with the drain electrode directly.

Still another embodiment of the disclosed technology provides a liquid crystal display, comprising: an array substrate according to any embodiment of the disclosed technology; a color filter substrate; and a liquid crystal layer interposed between the array substrate and the color filter substrate.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

The disclosed technology now will be described more clearly and fully hereinafter with reference to the accompanying drawings, in which the embodiments of the disclosed technology are shown. Apparently, only some embodiments of the disclosed technology, but not all of embodiments, are set forth here, and the disclosed technology may be embodied in other forms. All of other embodiments made by those skilled in the art based on embodiments disclosed herein without mental work fall within the scope of the disclosed technology.

First Embodiment

A manufacturing method for an array substrate according to the first embodiment of the disclosed technology comprises the following steps.

Step 101, forming a gate metal film on a substrate, applying a layer of photoresist on the gate metal film, and exposing and developing the photoresist with a double tone mask, so as to form a photoresist pattern including a first thickness region (a region with a first thickness), a second thickness region (a region with a second thickness) and a photoresist-completely-removed region.

The first thickness region is located above a gate line region, the second thickness region is located above a gate line leading wire region, and the first thickness is less than the second thickness.

Figure 1:
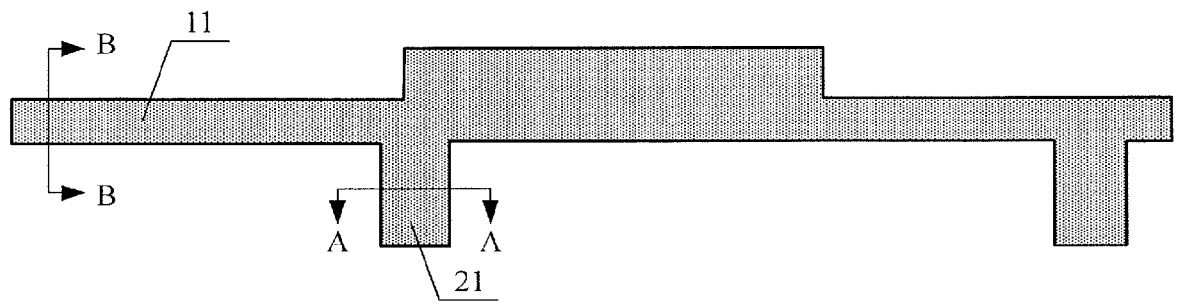
FIG. 1 is a schematic structural view of a gate line on an array substrate after a first patterning process in a manufacturing method for an array substrate provided by a first embodiment of the disclosed technology.
Figure 2:
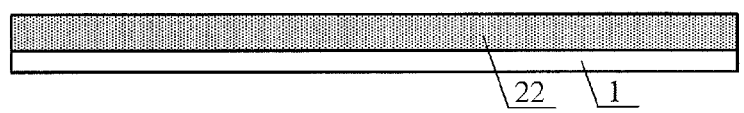
FIG. 2 is a cross-sectional schematic view taken along line A-A in FIG. 1 after a gate metal film is formed in the manufacturing method for the array substrate provided by the first embodiment of the disclosed technology.
Figure 3:
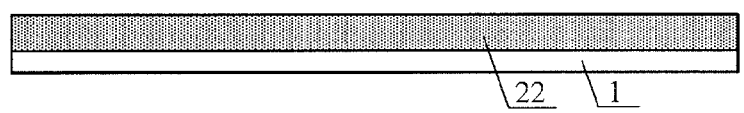
FIG. 3 is a cross-sectional schematic view taken along line B-B in FIG. 1 after the gate metal film is formed in the manufacturing method for the array substrate provided by the first embodiment of the disclosed technology.
Figure 4:
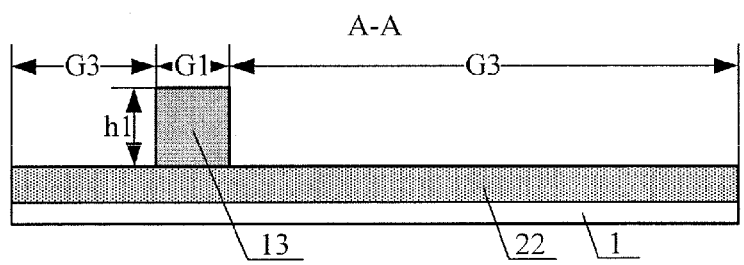
FIG. 4 is a cross-sectional schematic view taken along line A-A in FIG. 1 after a layer of photoresist applied on the gate metal film is exposed and developed in the manufacturing method for the array substrate provided by the first embodiment of the disclosed technology.
Figure 5:
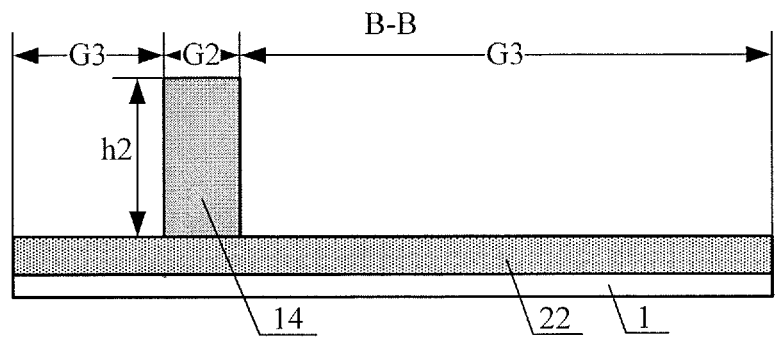
FIG. 5 is a cross-sectional schematic view taken along line B-B in FIG. 1 after the layer of photoresist applied on the gate metal film is exposed and developed in the manufacturing method for the array substrate provided by the first embodiment of the disclosed technology.

FIG. 1 is a schematic structural view of a gate line on an array substrate after a first patterning process in the manufacturing method for the array substrate provided by a first embodiment of the disclosed technology; FIG. 2 is a cross-sectional schematic view taken along line A-A in FIG. 1 after a gate metal film is formed in the manufacturing method for the array substrate provided by the first embodiment of the disclosed technology; FIG. 3 is a cross-sectional schematic view taken along line B-B in FIG. 1 after the gate metal film is formed in the manufacturing method for the array substrate provided by the first embodiment of the disclosed technology; FIG. 4 is a cross-sectional schematic view taken along line A-A in FIG. 1 after a layer of photoresist on the gate metal film is exposed and developed in the manufacturing method for the array substrate provided by the first embodiment of the disclosed technology; FIG. 5 is a cross-sectional schematic view taken along line B-B in FIG. 1 after the layer of photoresist on the gate metal film is exposed and developed in the manufacturing method for the array substrate provided by the first embodiment of the disclosed technology. As shown in FIGS. 1-5, the gate metal film 22 with a thickness of 500 Å to 4000 Å is deposited on a base substrate 1 by using a sputtering or a thermal evaporation method. The material of the gate metal film 22 may employ the metals such as Cr, W, Ti, Ta, Mo, Al or Cu, or alloys of the metals. The gate metal film may be formed of a single layer or multiple metal layers.

The layer of photoresist is applied on the gate metal film 22, and is exposed and developed with a double tone mask, e.g., a grey tone mask, so as to form a photoresist pattern including the first thickness region G1, the second thickness region G2 and the photoresist-completely-removed region G3. The photoresist pattern 13 in the first thickness region G1 is located above the gate line region 12, the photoresist pattern 14 in the second thickness region G2 is located above the gate line leading wire region, and the first thickness h1 is less than the second thickness h2. In the embodiment, the first thickness h1 of the photoresist pattern 13 in the first thickness region G1 is about 0.5 to 2 μm, the second thickness h2 of the photoresist pattern 14 in the second thickness region G2 is about 1 to 4 μm.

Step 102, etching so to remove the gate metal film corresponding to the photoresist-completely-removed region, and form a gate line, a gate electrode and a gate line leading wire, then ashing the photoresist so as to thin the photoresist by a thickness corresponding to the first thickness. That is to say, the photoresist in the first thickness region is removed and a part of the photoresist is remained in the second thickness region.

Figure 6:
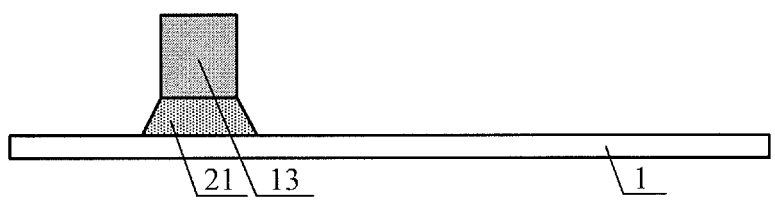
FIG. 6 is a cross-sectional schematic view after an etching procedure is performed on the patterns in FIG. 4 in the manufacturing method for the array substrate provided by the first embodiment of the disclosed technology.
Figure 7:
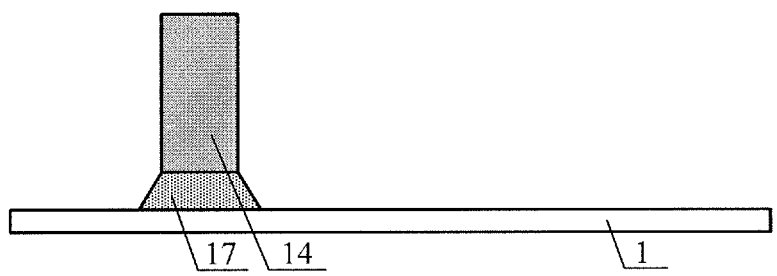
FIG. 7 is a cross-sectional schematic view after the etching procedure is performed on the patterns in FIG. 5 in the manufacturing method for the array substrate provided by the first embodiment of the disclosed technology.
Figure 8:
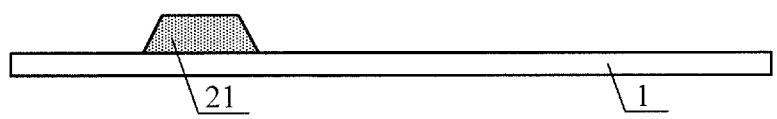
FIG. 8 is a cross-sectional schematic view after a photoresist ashing procedure is performed on the patterns in FIG. 6 in the manufacturing method for the array substrate provided by the first embodiment of the disclosed technology.
Figure 9:
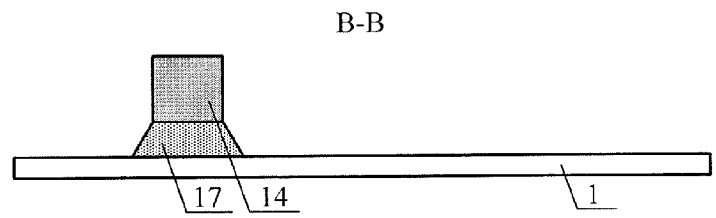
FIG. 9 is a cross-sectional schematic view after the photoresist ashing procedure is performed on the patterns in FIG. 7 in the manufacturing method for the array substrate provided by the first embodiment of the disclosed technology.

FIG. 6 is a cross-sectional schematic view after an etching procedure is performed on the patterns in FIG. 4 in the manufacturing method for the array substrate provided by the first embodiment of the disclosed technology; FIG. 7 is a cross-sectional schematic view after the etching procedure is performed on the patterns in FIG. 5 in the manufacturing method for the array substrate provided by the first embodiment of the disclosed technology; FIG. 8 is a cross-sectional schematic view after a photoresist ashing procedure is performed on the patterns in FIG. 6 in the manufacturing method for the array substrate provided by the first embodiment of the disclosed technology; FIG. 9 is a cross-sectional schematic view after the photoresist ashing procedure is performed on the patterns in FIG. 7 in the manufacturing method for the array substrate provided by the first embodiment of the disclosed technology.

As shown in FIGS. 6-9, by the etching procedure, the gate metal film 22 corresponding to the photoresist-completely-removed region G3 can be etched with a wet etching, so as to form a gate electrode 21 in the gate line region as shown in FIG. 6, and form the gate line leading wire 17 in the gate line leading wire region. After the etching procedure, the photoresist can be thinned in an oxygen-contained environment by an ashing process. Specifically, the photoresist pattern 13 in the first thickness region G1 may be removed completely, and a part of the photoresist pattern 14 in the second thickness region G2 is remained, and the remained thickness of the photoresist pattern is h2-h1. In the embodiment, the thickness of the remained photoresist pattern 14 is about 0.5 to 2 μm.

Thus, the first patterning process is completed according to the embodiment. After the patterning process, the remained photoresist pattern 14 in the gate line leading wire region is left and is not lifted off.

Step 103, sequentially depositing a gate insulating film, an active layer film and a source/drain metal film on the base substrate after Step 102, applying a layer of photoresist on the source/drain metal film, and exposing and developing the photoresist with a double tone mask, so as to froma a photoresist pattern including a third thickness region (a region with a third thickness), a fourth thickness region (a region with a fourth thickness) and a photoresist-completely-removed region.

The photoresist pattern in the third thickness region is located above a source/drain electrode region and a data line leading wire region, and the photoresist pattern in the fourth thickness region is located above a channel region, and the fourth thickness is less than the third thickness.

Figure 10:
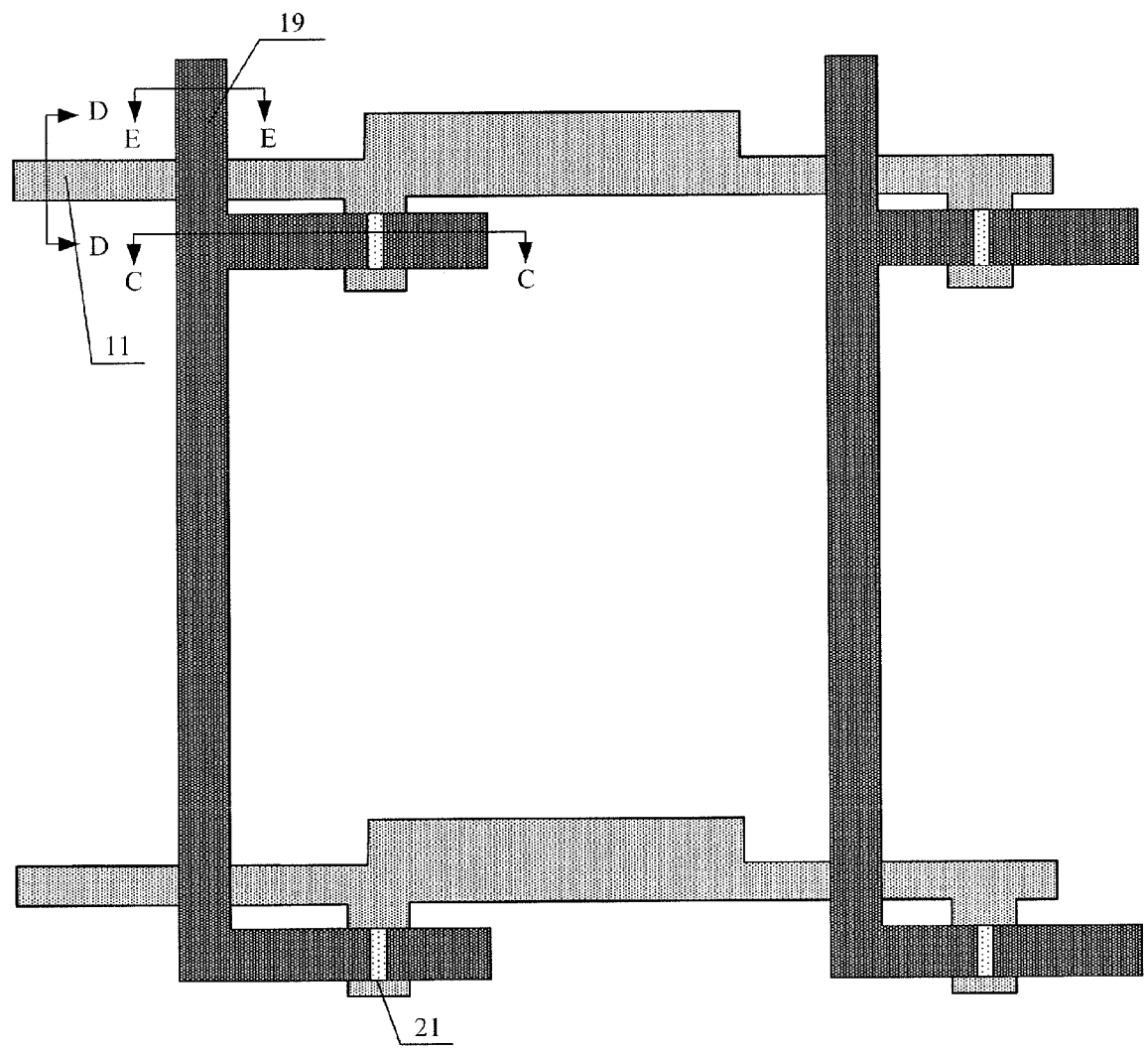
FIG. 10 is a schematic structural view of a pixel region after a second patterning process in the manufacturing method for the array substrate provided by the first embodiment of the disclosed technology.
Figure 11:
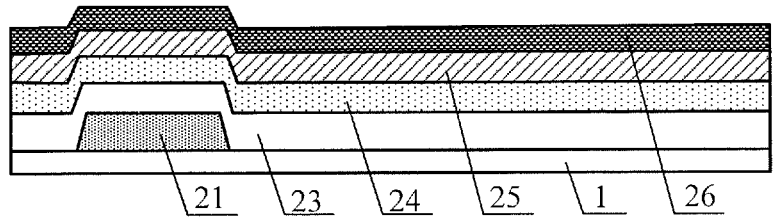
FIG. 11 is a cross-sectional schematic view taken along line C-C in FIG. 10 after a gate insulating film, an active layer film and a source/drain metal film are formed in the manufacturing method for the array substrate provided by the first embodiment of the disclosed technology.
Figure 12:
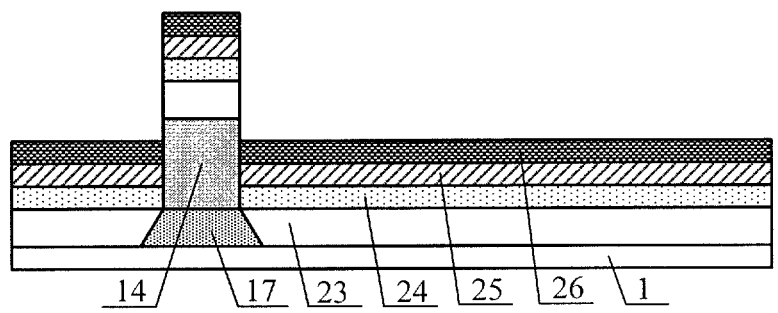
FIG. 12 is a cross-sectional schematic view taken along line D-D in FIG. 10 after the gate insulating film, the active layer film and the source/drain metal film are formed in the manufacturing method for the array substrate provided by the first embodiment of the disclosed technology.
Figure 13:
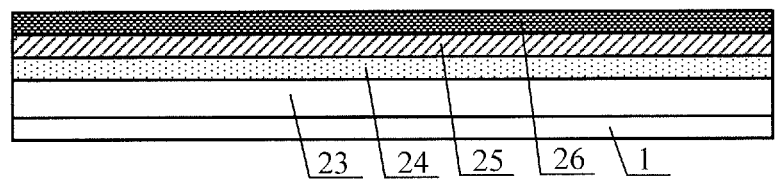
FIG. 13 is a cross-sectional schematic view taken along line E-E in FIG. 10 after the gate insulating film, the active layer film and the source/drain metal film are formed in the manufacturing method for the array substrate provided by the first embodiment of the disclosed technology.

FIG. 10 is a schematic structural view of a pixel region after a second patterning process in the manufacturing method for the array substrate provided by the first embodiment of the disclosed technology; FIG. 11 is a cross-sectional schematic view taken along line C-C in FIG. 10 after the gate insulating film, the active layer film and the source/drain metal film are formed in the manufacturing method for the array substrate provided by the first embodiment of the disclosed technology; FIG. 12 is a cross-sectional schematic view taken along line D-D in FIG. 10 after the gate insulating film, the active layer film and the source/drain metal film are formed in the manufacturing method for the array substrate provided by the first embodiment of the disclosed technology; and FIG. 13 is a cross-sectional schematic view taken along line E-E in FIG. 10 after the gate insulating film, the active layer film and the source/drain metal film are formed in the manufacturing method for the array substrate provided by the first embodiment of the disclosed technology. As shown in FIGS. 10-13, the gate insulating film 23 with a thickness of 1000 Å to 6000 Å, a semiconductor layer film 24 with a thickness of 1000 Å to 6000 Å, a doped semiconductor layer film 25 with a thickness of 200 Å to 1000 Å are sequentially deposited on the base substrate 1 by a chemical vapor deposition. In the embodiment, the semiconductor layer film 24 and the doped semiconductor film 25 constitute the active layer film. Then, the source/drain metal film 26 with a thickness of 1000 Å to 7000 Å is deposited by a magnetic sputtering or a thermal evaporation method.

Figure 14:
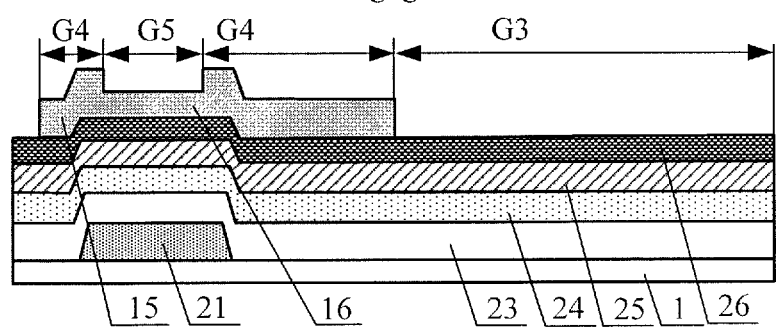
FIG. 14 is a cross-sectional schematic view taken along line C-C in FIG. 10 after a photoresist pattern is formed on the source/drain metal film in the manufacturing method for the array substrate provided by the first embodiment of the disclosed technology.
Figure 15:
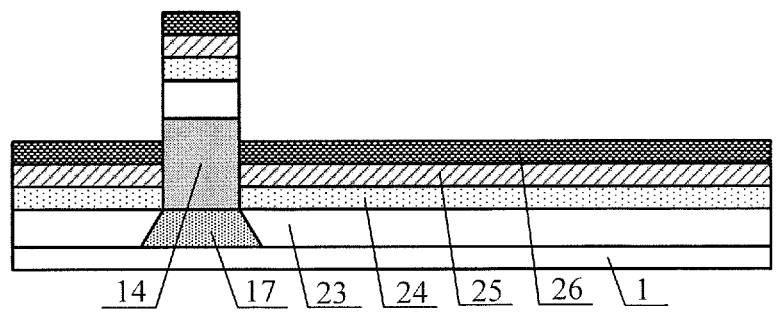
FIG. 15 is a cross-sectional schematic view taken along line D-D in FIG. 10 after the photoresist pattern is formed on the source/drain metal film in the manufacturing method for the array substrate provided by the first embodiment of the disclosed technology.
Figure 16:
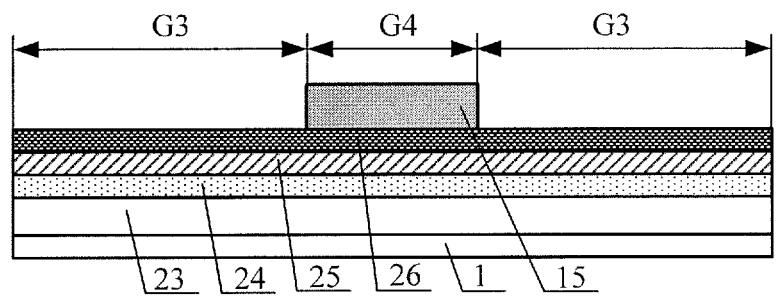
FIG. 16 is a cross-sectional schematic view taken along line E-E in FIG. 10 after the photoresist pattern is formed on the source/drain metal film in the manufacturing method for the array substrate provided by the first embodiment of the disclosed technology.

FIG. 14 is a cross-sectional schematic view taken along line C-C in FIG. 10 after a photoresist pattern is formed on the source/drain metal film in the manufacturing method for the array substrate provided by the first embodiment of the disclosed technology; FIG. 15 is a cross-sectional schematic view taken along line D-D in FIG. 10 after the photoresist pattern is formed on the source/drain metal film in the manufacturing method for the array substrate provided by the first embodiment of the disclosed technology; and FIG. 16 is a cross-sectional schematic view taken along line E-E in FIG. 10 after the photoresist pattern is formed on the source/drain metal film in the manufacturing method for the array substrate provided by the first embodiment of the disclosed technology. As shown in FIGS. 14-16, the layer of photoresist is applied on the source/drain metal film 26, and is exposed with a double tone mask, e.g., a grey tone mask, so as to form a photoresist pattern including the third thickness region G4, the fourth thickness region G5 and the photoresist-completely-removed region G3. The photoresist pattern 15 in the third thickness region G4 is located above the source/drain electrode region and the data line leading wire 18, and the photoresist pattern 16 in the fourth thickness region G5 is located above the channel region, and the fourth thickness h4 is less than the third thickness h3. In the embodiment, the third thickness h3 of the photoresist pattern 15 in the third thickness region G4 is about 1 to 2 μm, and the fourth thickness h4 of the photoresist pattern 16 in the fourth thickness region G5 is about 0.5 to 2 μm. The photoresist pattern formed in Step 103 is not formed above the gate line leading wire 17, as shown in FIG. 15.

Step 104, etching so as to remove completely the semiconductor layer film, the doped semiconductor layer film and the source/drain metal film corresponding to the photoresist-completely-removed region; ashing the photoresist so as to thin it by a thickness corresponding to the fourth thickness, i.e., the photoresist in the fourth thickness region is removed and a part of the photoresist in the third thickness region is remained; and etching so as to etch the source/drain metal film, the doped semiconductor layer film and a part of the semiconductor layer film in the channel region and form a TFT channel; and lifting off the remained photoresist pattern, and simultaneously lifting off the gate insulating film and the photoresist above the gate line leading wire region so as to expose the gate line leading wire.

Figure 17:
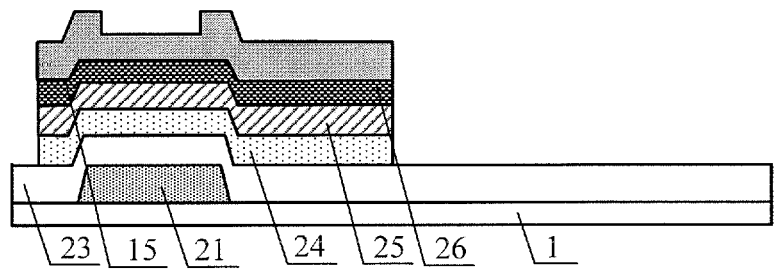
FIG. 17 is a cross-sectional schematic view taken along line C-C in FIG. 10 after an etching procedure is performed on the structure as shown in FIG. 14 in the manufacturing method for the array substrate provided by the first embodiment of the disclosed technology.
Figure 18:
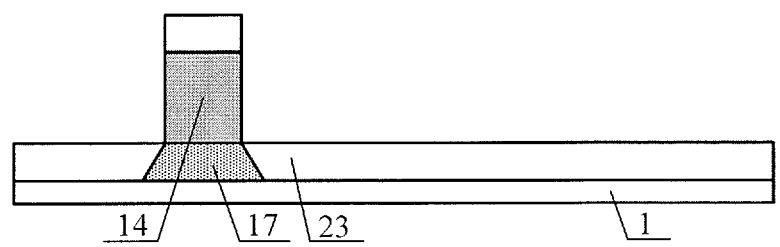
FIG. 18 is a cross-sectional schematic view taken along line D-D in FIG. 10 after the etching procedure is performed on the structure as shown in FIG. 15 in the manufacturing method for the array substrate provided by the first embodiment of the disclosed technology.
Figure 19:
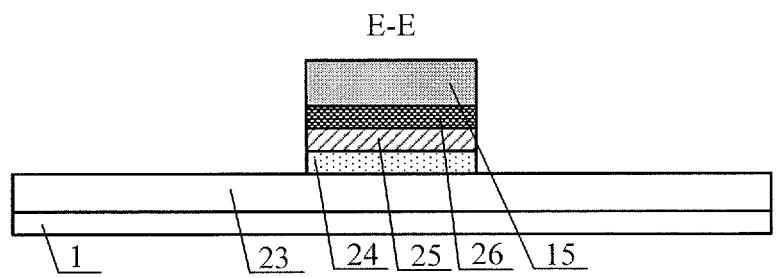
FIG. 19 is a cross-sectional schematic view taken along line E-E in FIG. 10 after the etching procedure is performed on the structure as shown in FIG. 16 in the manufacturing method for the array substrate provided by the first embodiment of the disclosed technology.

FIG. 17 is a cross-sectional schematic view taken along line C-C in FIG. 10 after an etching procedure is performed on the structure as shown in FIG. 14 in the manufacturing method for the array substrate provided by the first embodiment of the disclosed technology; FIG. 18 is a cross-sectional schematic view taken along line D-D in FIG. 10 after the etching procedure is performed on the structure as shown in FIG. 15 in the manufacturing method for the array substrate provided by the first embodiment of the disclosed technology; and FIG. 19 is a cross-sectional schematic view taken along line E-E in FIG. 10 after the etching procedure is performed on the structure as shown in FIG. 16 in the manufacturing method for the array substrate provided by the first embodiment of the disclosed technology. As shown in FIGS. 17-19, by a wet etching and a subsequent dry etching, the semiconductor layer film 24, the doped semiconductor layer film 25 and the source/drain metal film 26 corresponding to the photoresist-completely-removed region G3 is removed under the effect of ion-bombing and chemical reaction. Then, the photoresist is ashed so as to be thinned by a thickness corresponding to the fourth thickness h4 of the photoresist in the fourth thickness region G5.

Figure 20:
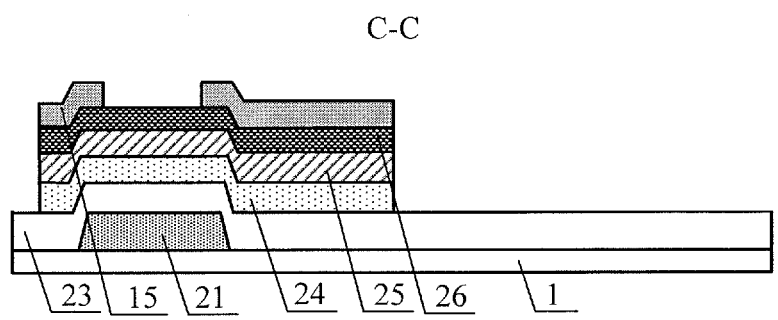
FIG. 20 is a cross-sectional schematic view after a photoresist ashing procedure is performed on the patterns in FIG. 17 in the manufacturing method for the array substrate provided by the first embodiment of the disclosed technology.
Figure 21:
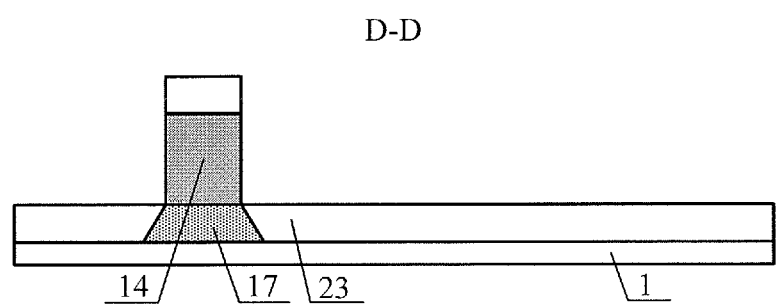
FIG. 21 is a cross-sectional schematic view after the photoresist ashing procedure is performed on the patterns in FIG. 18 in the manufacturing method for the array substrate provided by the first embodiment of the disclosed technology.
Figure 22:
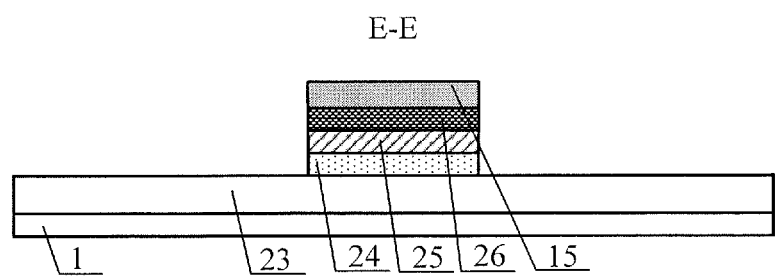
FIG. 22 is a cross-sectional schematic view after the photoresist ashing procedure is performed on the patterns in FIG. 19 in the manufacturing method for the array substrate provided by the first embodiment of the disclosed technology.

FIG. 20 is a cross-sectional schematic view after a photoresist ashing procedure is performed on the patterns in FIG. 17 in the manufacturing method for the array substrate provided by the first embodiment of the disclosed technology; FIG. 21 is a cross-sectional schematic view after the photoresist ashing procedure is performed on the patterns in FIG. 18 in the manufacturing method for the array substrate provided by the first embodiment of the disclosed technology; and FIG. 22 is a cross-sectional schematic view after the photoresist ashing procedure is performed on the patterns in FIG. 19 in the manufacturing method for the array substrate provided by the first embodiment of the disclosed technology. As shown in FIGS. 20-22, the photoresist is thinned under an oxygen-contained environment, the photoresist with the fourth thickness is ashed and a part of the photoresist with the third thickness is remained to be a thickness of 0.2 to 1 μm.

Figure 23:
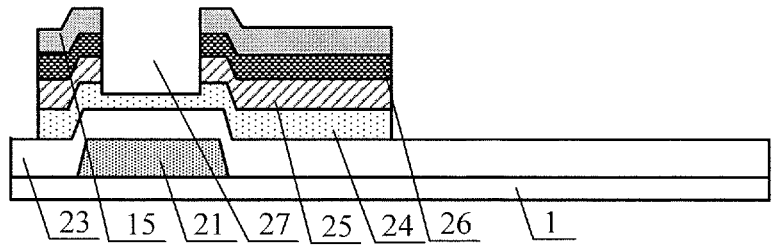
FIG. 23 is a cross-sectional schematic view after an etching procedure is performed on the structure as shown in FIG. 20 in the manufacturing method for the array substrate provided by the first embodiment of the disclosed technology.
Figure 24:
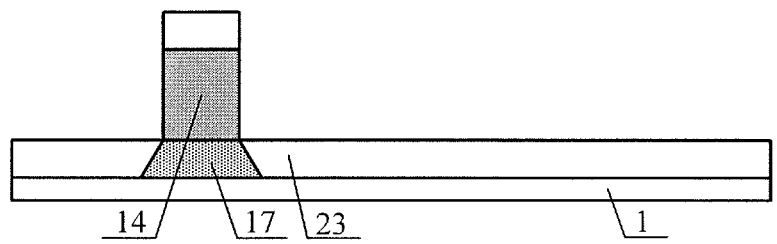
FIG. 24 is a cross-sectional schematic view after the etching procedure is performed on the structure the structure as shown in FIG. 21 in the manufacturing method for the array substrate provided by the first embodiment of the disclosed technology.
Figure 25:
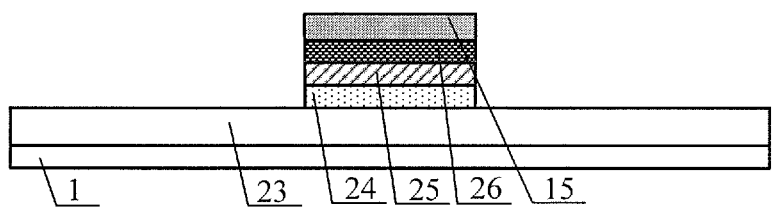
FIG. 25 is a cross-sectional schematic view after the etching procedure is performed on the structure the structure as shown in FIG. 22 in the manufacturing method for the array substrate provided by the first embodiment of the disclosed technology.

FIG. 23 is a cross-sectional schematic view after an etching procedure is performed on the structure as shown in FIG. 20 in the manufacturing method for the array substrate provided by the first embodiment of the disclosed technology; FIG. 24 is a cross-sectional schematic view after the etching procedure is performed on the structure the structure as shown in FIG. 21 in the manufacturing method for the array substrate provided by the first embodiment of the disclosed technology; and FIG. 25 is a cross-sectional schematic view after the etching procedure is performed on the structure the structure as shown in FIG. 22 in the manufacturing method for the array substrate provided by the first embodiment of the disclosed technology. As shown in FIGS. 23-25, by a dry etching, the source/drain metal film 26, the doped semiconductor layer film 25 and a part of the semiconductor layer film 24 corresponding to the channel region are etched so as to form the TFT channel 27.

Figure 26:
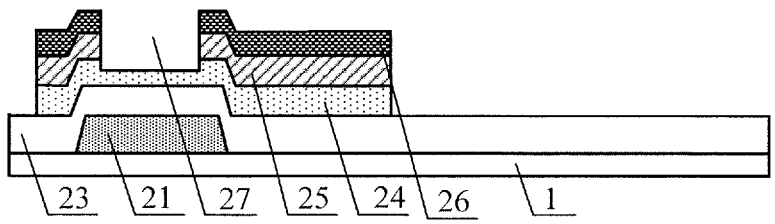
FIG. 26 is a cross-sectional schematic view after a photoresist lifting-off procedure is performed on the patterns in FIG. 23 in the manufacturing method for the array substrate provided by the first embodiment of the disclosed technology.
Figure 27:
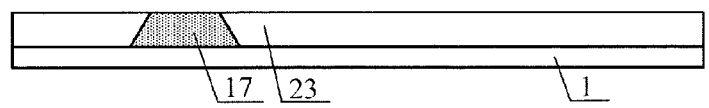
FIG. 27 is a cross-sectional schematic view after the photoresist lifting-off procedure is performed on the patterns in FIG. 24 in the manufacturing method for the array substrate provided by the first embodiment of the disclosed technology.
Figure 28:
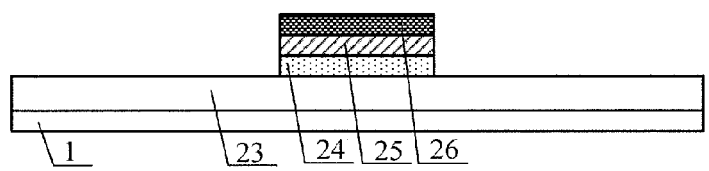
FIG. 28 is a cross-sectional schematic view after the photoresist lifting-off procedure is performed on the patterns in FIG. 25 in the manufacturing method for the array substrate provided by the first embodiment of the disclosed technology.

FIG. 26 is a cross-sectional schematic view after a photoresist lifting-off procedure is performed on the patterns in FIG. 23 in the manufacturing method for the array substrate provided by the first embodiment of the disclosed technology; FIG. 27 is a cross-sectional schematic view after the photoresist lifting-off procedure is performed on the patterns in FIG. 24 in the manufacturing method for the array substrate provided by the first embodiment of the disclosed technology; and FIG. 28 is a cross-sectional schematic view after the photoresist lifting-off procedure is performed on the patterns in FIG. 25 in the manufacturing method for the array substrate provided by the first embodiment of the disclosed technology. As shown in FIGS. 26-28, the photoresist is removed by a lifting-off process, so that the gate insulating film 23 above the gate line leading wire is also lifted off.

Thus, the second patterning process is completed according to the embodiment, and the TFT channel is formed.

Step 105, forming a pixel electrode and a protection layer on the base substrate after Step 104.

Step 105 can be implemented by any method in the prior art, for example, a passivation layer is deposited on the base substrate after the Step 104 by a plasma enhanced chemical vapor deposition (PECVD). The passivation layer may employ oxide, nitride or oxynitride. A passivation layer via hole is formed by patterning the passivation layer with a normal mask, and a passivation layer via hole is located above the drain electrode. A layer of transparent conductive film is deposited by a magnetic sputtering or a thermal evaporation method. The transparent conductive film may employ indium tin oxide (ITO), indium zinc oxide (IZO), aluminum zinc oxide or the like, or other metals or metal oxides. The pixel electrode is formed by a patterning process with a normal mask. The pixel electrode is formed in the pixel region and connected with the drain electrode through the passivation layer via hole.

Thus, the third and fourth patterning processes are completed according to the embodiment so as to from the array substrate.

In the manufacturing method for the array substrate according to the embodiment, only four masking processes are used: the first one is used to form the gate line, the gate electrode and the gate line leading wire; the second one is used to form the TFT channel, the source electrode, the drain electrode, the data line, and the data line leading wire, the third one is used to form the passivation layer via hole; and the fourth one is used to form the pixel electrode. In the embodiment, when the gate line leading wire is formed, a part of photoresist is remained on it. Therefore, the gate line leading wire can be exposed by removing the photoresist and films formed thereon by lifting the photoresist after the other patterns are formed, so as to avoid forming a via hole for connecting the gate line leading wire through an individual patterning process. Therefore, the array substrate can be manufactured by a 4 Mask process, which simplifies the manufacturing process for array substrate and reduce the manufacturing cost for the array substrate.

Second Embodiment

A manufacturing method for an array substrate according to the second embodiment of the disclosed technology comprises the following steps.

Step 201, forming a gate metal film on a substrate, applying a layer of photoresist on the gate metal film, and exposing and developing the photoresist with a double tone mask, so as to form a photoresist pattern including a first thickness region, a second thickness region and a photoresist-completely-removed region.

The photoresist pattern in the first thickness region is located above a gate line region, the second thickness region is located above a gate line leading wire region, and the first thickness is less than the second thickness.

Step 202, etching so to remove the gate metal film corresponding to the photoresist-completely-removed region, and form a gate line, a gate electrode and a gate line leading wire, then ashing the photoresist so as to thin the photoresist by a thickness corresponding to the first thickness. That is to say, the photoresist in the first thickness region is removed.

Step 203, sequentially depositing a gate insulating film, a semiconductor layer film, a doped semiconductor layer film and a source/drain metal film on the base substrate after Step 202, applying a layer of photoresist on the source/drain metal film, and exposing and developing the photoresist with a double tone mask, so as to from a photoresist pattern including a third thickness region, a fourth thickness region and a photoresist-completely-removed region.

The photoresist pattern in the third thickness region is located above a source/drain electrode region and a data line leading wire region, and the photoresist pattern in the fourth thickness region is located above a channel region, and the fourth thickness is less than the third thickness.

Step 204, etching so as to remove completely the semiconductor layer film, the doped semiconductor layer film and the source/drain metal film corresponding to the photoresist-completely-removed region; ashing the photoresist so as to thin it by a thickness corresponding to the fourth thickness, i.e., the photoresist in the fourth thickness region is removed and a part of the photoresist in the third thickness region is remained; and etching so as to etch the source/drain metal film, the doped semiconductor layer film and a part of the semiconductor layer film in the channel region and form a TFT channel; and lifting off the remained photoresist pattern, and simultaneously lifting off the gate insulating film and the photoresist above the gate line leading wire region so as to expose the gate line leading wire.

The above steps 201-204 are implemented with a similar method as that in the first embodiment. The structures formed on the base substrate are also similar to those as shown in FIGS. 2-28, which will not be described repeatedly. Hereinafter, the third patterning process according to the embodiment will be described in detail.

Step 205, depositing a transparent electrode layer on the substrate after Step 204, applying a layer of photoresist on the transparent electrode layer, and exposing and developing the photoresist with a single tone mask so as to form a photoresist pattern located above the pixel electrode region, the gate line leading wire region and the data line leading wire region.

Figure 29:
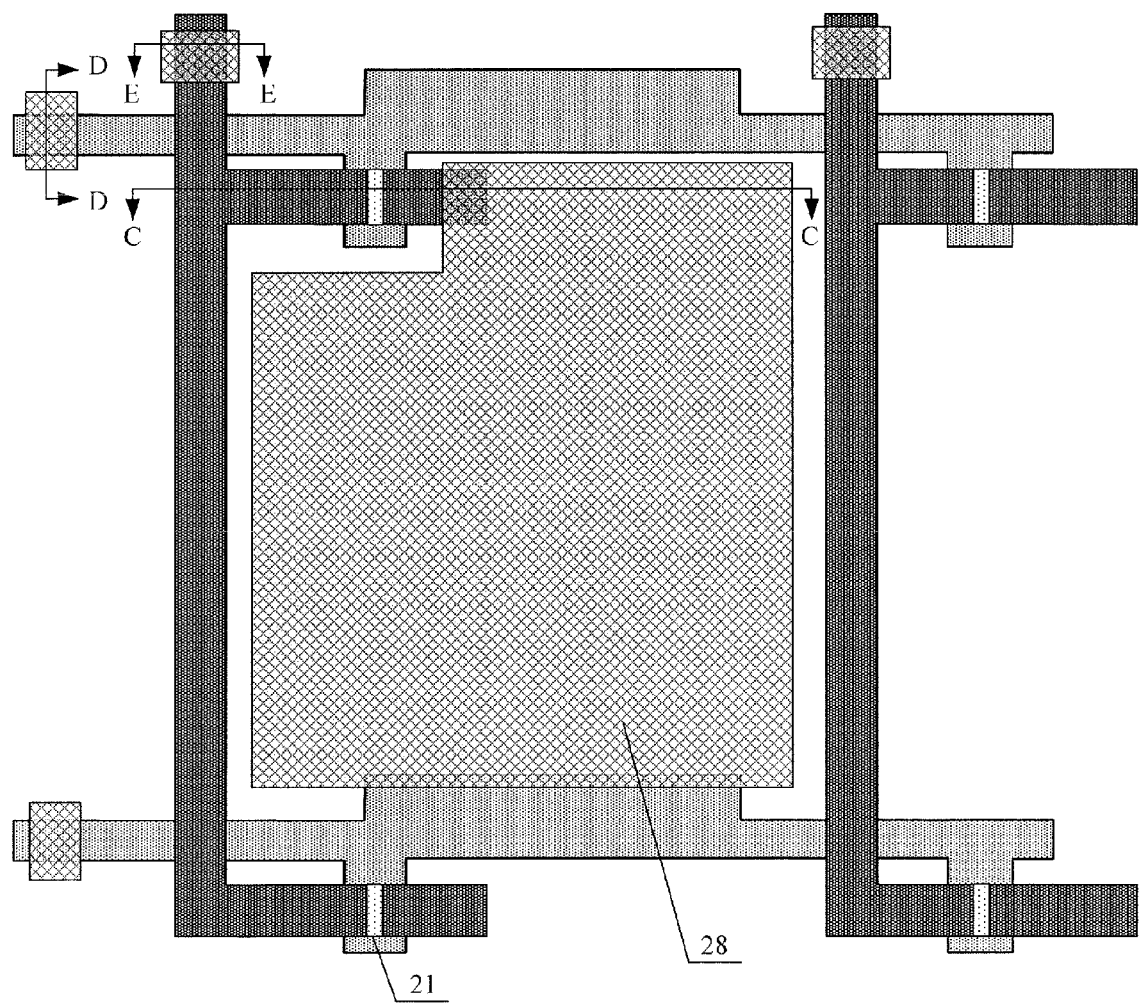
FIG. 29 is a schematic structural view of a pixel region after a third patterning process in a manufacturing method for an array substrate provided by a second embodiment of the disclosed technology.
Figure 30:
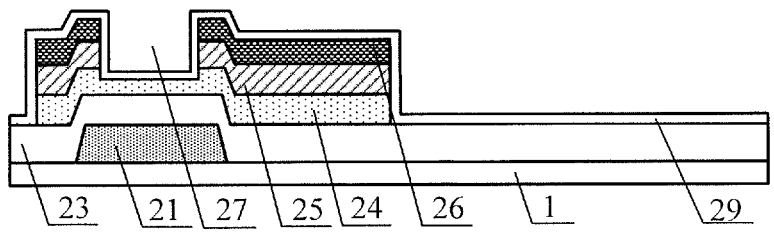
FIG. 30 is a cross-sectional view taken along line C-C in FIG. 29 after a transparent electrode layer is deposited in the manufacturing method for the array substrate provided by the second embodiment of the disclosed technology.
Figure 31:
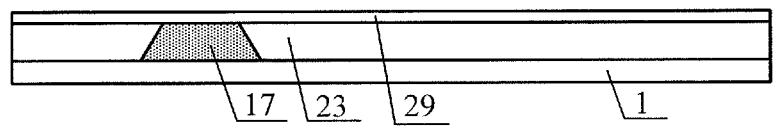
FIG. 31 is a cross-sectional view taken along line D-D in FIG. 29 after the transparent electrode layer is deposited in the manufacturing method for the array substrate provided by the second embodiment of the disclosed technology.
Figure 32:
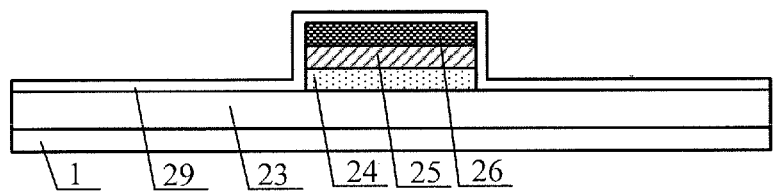
FIG. 32 is a cross-sectional view taken along line E-E in FIG. 29 after the transparent electrode layer is deposited in the manufacturing method for the array substrate provided by the second embodiment of the disclosed technology.

FIG. 29 is a schematic structural view of a pixel region after a third patterning process in the manufacturing method for the array substrate provided by the second embodiment of the disclosed technology; FIG. 30 is a cross-sectional view taken along line C-C in FIG. 29 after a transparent electrode layer is deposited in the manufacturing method for the array substrate provided by the second embodiment of the disclosed technology; FIG. 31 is a cross-sectional view taken along line D-D in FIG. 29 after the transparent electrode layer is deposited in the manufacturing method for the array substrate provided by the second embodiment of the disclosed technology; and FIG. 32 is a cross-sectional view taken along line E-E in FIG. 29 after the transparent electrode layer is deposited in the manufacturing method for the array substrate provided by the second embodiment of the disclosed technology. As shown in FIGS. 29-32, the transparent electrode layer 29 can be deposited by a magnetic sputtering or a thermal evaporation method, and the transparent electrode layer 29 may employ indium tin oxide (ITO), indium zinc oxide (IZO) or aluminum zinc oxide, or other metals or metal oxides.

Figure 33:
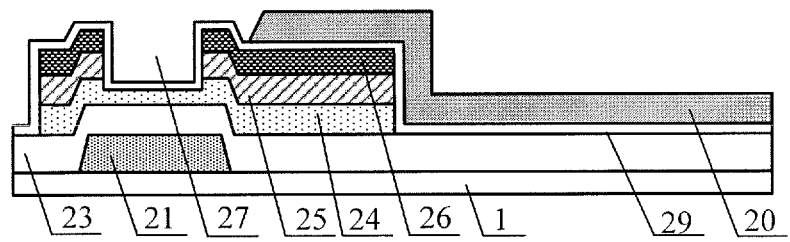
FIG. 33 is a cross-sectional view taken along line C-C in FIG. 29 after a photoresist pattern is formed on the transparent electrode layer in the manufacturing method for the array substrate provided by the second embodiment of the disclosed technology.
Figure 34:
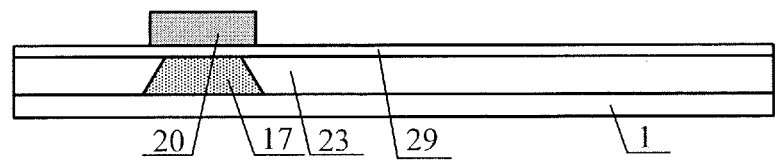
FIG. 34 is a cross-sectional view taken along line D-D in FIG. 29 after the photoresist pattern is formed on the transparent electrode layer in the manufacturing method for the array substrate provided by the second embodiment of the disclosed technology.
Figure 35:
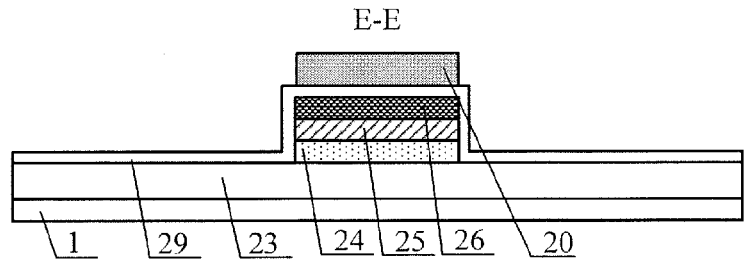
FIG. 35 is a cross-sectional view taken along line E-E in FIG. 29 after the photoresist pattern is formed on the transparent electrode layer in the manufacturing method for the array substrate provided by the second embodiment of the disclosed technology.

FIG. 33 is a cross-sectional view taken along line C-C in FIG. 29 after a photoresist pattern is formed on the transparent electrode layer in the manufacturing method for the array substrate provided by the second embodiment of the disclosed technology; FIG. 34 is a cross-sectional view taken along line D-D in FIG. 29 after the photoresist pattern is formed on the transparent electrode layer in the manufacturing method for the array substrate provided by the second embodiment of the disclosed technology; and FIG. 35 is a cross-sectional view taken along line E-E in FIG. 29 after the photoresist pattern is formed on the transparent electrode layer in the manufacturing method for the array substrate provided by the second embodiment of the disclosed technology. As shown in FIGS. 33-35, the photoresist may be applied on the transparent electrode layer 29, and then it was exposed and developed with a single tone mask so as to form the photoresist pattern 20 located above the pixel electrode region 28, the gate line leading wire region 11, and the data line leading wire region 19.

Step 206, etching so as to form the pixel electrode.

Figure 36:
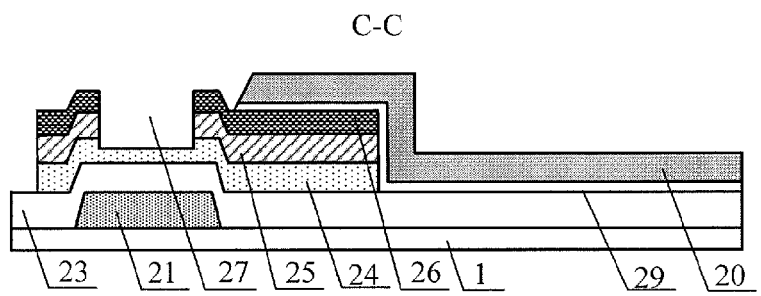
FIG. 36 is a cross-sectional view taken along line C-C in FIG. 29 after an etching procedure is performed on the structure of FIG. 33 in the manufacturing method for the array substrate provided by the second embodiment of the disclosed technology.
Figure 37:
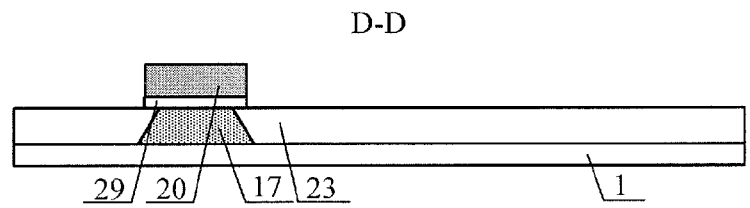
FIG. 37 is a cross-sectional view taken along line D-D in FIG. 29 after the etching procedure is performed on the structure of FIG. 34 in the manufacturing method for the array substrate provided by the second embodiment of the disclosed technology.
Figure 38:
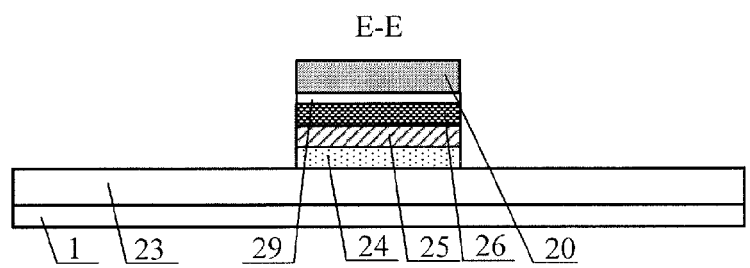
FIG. 38 is a cross-sectional view taken along line E-E in FIG. 29 after the etching procedure is performed on the structure of FIG. 35 in the manufacturing method for the array substrate provided by the second embodiment of the disclosed technology.

FIG. 36 is a cross-sectional view after an etching procedure is performed on the structure of FIG. 33 in the manufacturing method for the array substrate provided by the second embodiment of the disclosed technology; FIG. 37 is a cross-sectional view after the etching procedure is performed on the structure of FIG. 34 in the manufacturing method for the array substrate provided by the second embodiment of the disclosed technology; and FIG. 38 is a cross-sectional view after the etching procedure is performed on the structure of FIG. 35 in the manufacturing method for the array substrate provided by the second embodiment of the disclosed technology. As shown in FIGS. 36-38, the transparent electrode layer 29 in the location not protected by the photoresist pattern 20 is etched so as to form a pixel electrode and expose a TFT channel 27.

Step 207, forming a protection film on the substrate after Step 206, and lifting off the photoresist and the protection film formed thereon so as to form a protection layer.

Figure 39:
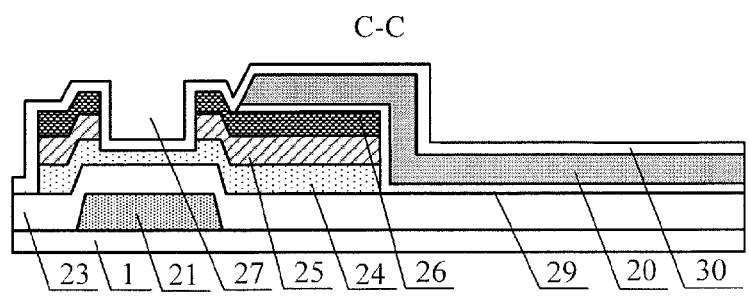
FIG. 39 is a cross-sectional view taken along line C-C in FIG. 29 after a protection film is deposited in the manufacturing method for the array substrate provided by the second embodiment of the disclosed technology.
Figure 40:
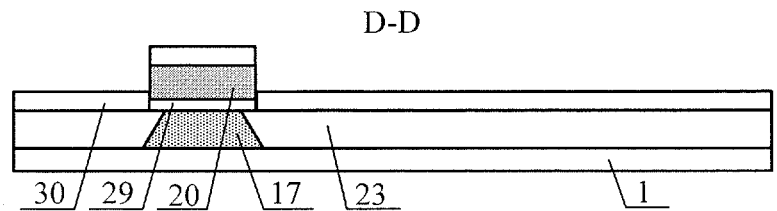
FIG. 40 is a cross-sectional view taken along line D-D in FIG. 29 after the protection film is deposited in the manufacturing method for the array substrate provided by the second embodiment of the disclosed technology.
Figure 41:
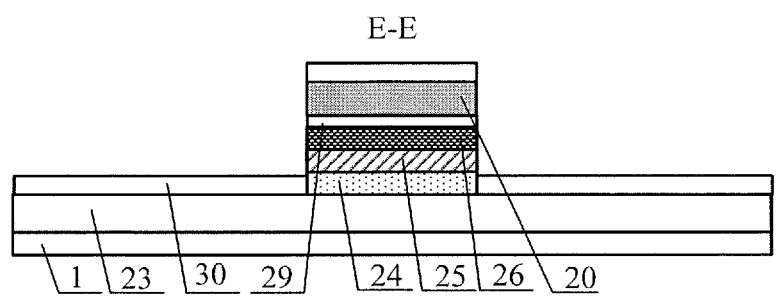
FIG. 41 is a cross-sectional view taken along line E-E in FIG. 29 after the protection film is deposited in the manufacturing method for the array substrate provided by the second embodiment of the disclosed technology.

FIG. 39 is a cross-sectional view taken along line C-C in FIG. 29 after a protection film is deposited in the manufacturing method for the array substrate provided by the second embodiment of the disclosed technology; FIG. 40 is a cross-sectional view taken along line D-D in FIG. 29 after the protection film is deposited in the manufacturing method for the array substrate provided by the second embodiment of the disclosed technology; and FIG. 41 is a cross-sectional view taken along line E-E in FIG. 29 after the protection film is deposited in the manufacturing method for the array substrate provided by the second embodiment of the disclosed technology. As shown in FIGS. 39-41, the protection film with a thickness of 1000 to 6000 Å is deposited on the base substrate with a chemical vapor deposition, and the protection film 30 covers on the TFT channel 27, the pixel electrode region 28, the gate line leading wire region 11 and the data line leading wire region 19.

Figure 42:
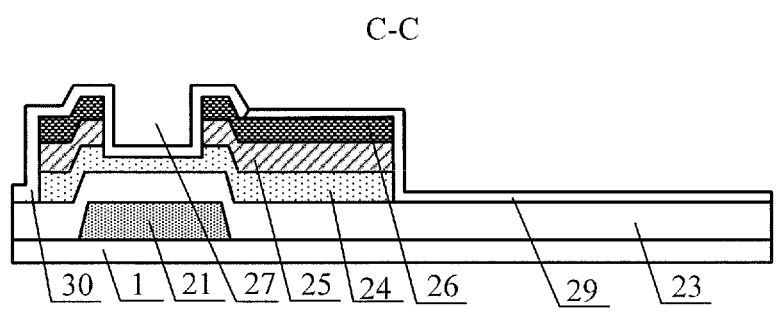
FIG. 42 is a cross-sectional view taken along line C-C in FIG. 29 after the photoresist is lifted off in FIG. 39 in the manufacturing method for the array substrate provided by the second embodiment of the disclosed technology.
Figure 43:
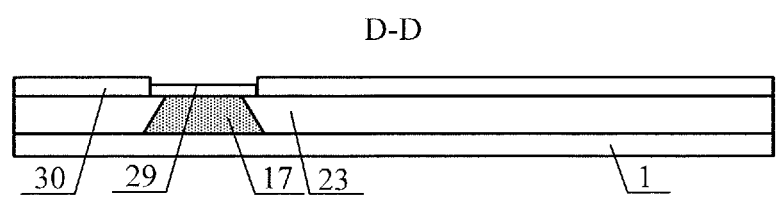
FIG. 43 is a cross-sectional view taken along line D-D in FIG. 29 after the photoresist is lifted off in FIG. 40 in the manufacturing method for the array substrate provided by the second embodiment of the disclosed technology.
Figure 44:
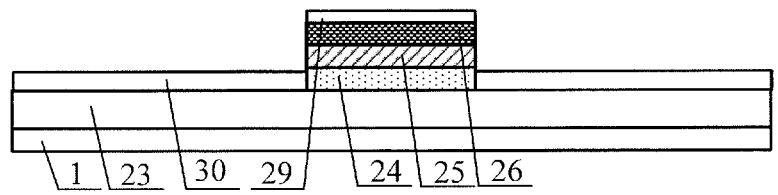
FIG. 44 is a cross-sectional view taken along line E-E in FIG. 29 after the photoresist is lifted off in FIG. 41 in the manufacturing method for the array substrate provided by the second embodiment of the disclosed technology.

FIG. 42 is a cross-sectional view taken along line C-C in FIG. 29 after the photoresist is lifted off in the manufacturing method for the array substrate provided by the second embodiment of the disclosed technology; FIG. 43 is a cross-sectional view taken along line D-D in FIG. 29 after the photoresist is lifted off in the manufacturing method for the array substrate provided by the second embodiment of the disclosed technology; and FIG. 44 is a cross-sectional view taken along line E-E in FIG. 29 after the photoresist is lifted off in the manufacturing method for the array substrate provided by the second embodiment of the disclosed technology. As shown in FIGS. 42-44, the photoresist above the pixel electrode region 28, the gate line leading wire region 11 and the data line leading wire region 19 is lifted off by a lifting-off process, so that the protection film 30 above the pixel electrode region 28, the gate line leading wire region 11 and the data line leading wire region 19 are also lifted off together.

Thus, the third patterning process according to the embodiment is completed, and the array substrate is formed. It should be noted that, in the present embodiment, the sequence for depositing the protection film and the transparent electrode layer is inversed comparing with that in the first embodiment. The step for forming the passivation layer via hole may be omitted by depositing the transparent electrode layer before the protection film.

The steps 201-204 in the embodiment are implemented with a similar method as that in the first embodiment, i.e., when the gate line leading wire is formed, a part of photoresist is remained on it. Therefore, the gate line leading wire can be exposed by removing the photoresist and films formed thereon by lifting the photoresist after the other patterns are formed, so as to avoid forming a via hole for connecting the gate line leading wire through an individual patterning process. In addition, in the manufacturing method for the array substrate according to the embodiment, only three masking processes are used: the first one is to form the gate line, the gate electrode and the gate line leading wire; the second one is to form the TFT channel, the source electrode, the drain electrode, the data line, and the data line leading wire; and the third one is to form the pixel electrode. According to the embodiment, the array substrate can be fabricated by using three masking process and fourth etching processes, which simplify the manufacturing process for array substrate and reduce the cost for manufacturing the array substrate.

Although the steps 201-204 for forming the gate line, the gate electrode, the gate line leading wire, the source/drain electrodes, the data line, the data line leading wire and the active layer (including the channel region) in the second embodiment are implemented with a similar method as that in the first embodiment, the method for forming the above patterns are not limited to that as shown in the steps 101-104 in the first embodiment or the steps 201-204 in the second embodiment, but can also use any method known in the technical field. In this case, the pixel electrode and the protection layer can also be formed in the same patterning process, which simplifies the manufacturing process.

Another embodiment of the disclosed technology provides an array substrate, on which conductive patterns and a pixel electrode are formed. The conductive patterns comprise a gate line, a gate electrode, a data line, an active layer, a source electrode and a drain electrode, and the pixel electrode is connected with the drain electrode directly.

Specifically, the array substrate according to the embodiment can employ the structure as shown in FIG. 42, and the manufacturing method for it can adopt the method according to the above embodiment, which will not be described repeatedly. As for the array substrate according to the embodiment, the pixel electrode and the drain electrode are connected with each other directly without a via hole therebetween; therefore, comparing with the via hole connecting manner, the structure according to the embodiment can ensure the reliable conducting between the pixel electrode and the drain electrode, which improves the quality of the array substrate. In addition, the protection layer formed on the substrate covers on the data line, the channel region, the source electrode and a part of the drain electrode, and the protection layer and the pixel electrode come into a lateral contact with each other, as shown in FIG. 42. Herein, the lateral contact means that the protection layer and the pixel electrode are contacted with each other in a direction perpendicular to the thickness direction of the base substrate, but not laminated with each other in the thickness direction of the base substrate.

An embodiment of the disclosed technology also provides a liquid crystal display, which comprises an array substrate according to any embodiment of the disclosed technology, a color filter substrate and a liquid crystal layer interposed between the array substrate and the color filter substrate.

It can be understood by those skilled in the art that the entire or a part of the method according to the above embodiments can be performed through hardware, software, firmware of a program. The program can be stored in a computer readable storage medium. When the above program is conducted, the steps in the above method embodiments can be performed. The above storage medium comprises various media which can storage program code, such as ROM, RAM, magnetic disk or optical disk.

It should be noted that: the above embodiments only have a purpose of illustrating the disclosed technology, but not limiting it. Although the disclosed technology has been described with reference to the above embodiment, those skilled in the art should understand that modifications or alternations can be made to the solution or the technical feature in the described embodiments without departing from the spirit and scope of the disclosed technology.

What is claimed is:

1. A manufacturing method for an array substrate, comprising:
   Step 1, forming a gate metal film on a base substrate, applying a layer of photoresist on the gate metal film, and exposing and developing the photoresist with a double tone mask, so as to form a photoresist pattern including a first thickness region, a second thickness region and a photoresist-completely-removed region, the photoresist pattern in the first thickness region being at least located above a gate region, the photoresist pattern in the second thickness region being located above the gate line leading wire region, and the first thickness is less than the second thickness;
   Step 2, etching so to remove the gate metal film corresponding to the photoresist-completely-removed region, and form a gate line, a gate electrode and a gate line leading wire; then ashing the photoresist so as to thin the photoresist by a thickness corresponding to the first thickness and remain a part of photoresist above the gate line leading wire region;
   Step 3, sequentially depositing a gate insulating film, an active layer film and a source/drain metal film on the base substrate after Step 2, applying a layer of photoresist on the source/drain metal film, and exposing and developing the photoresist with a double tone mask, so as to from a photoresist pattern including a third thickness region, a fourth thickness region and a photoresist-completely-removed region, the photoresist pattern in the third thickness region being at least located above a source/drain electrode region and a data line leading wire region, and the photoresist pattern in the fourth thickness region being located above a channel region, and the fourth thickness being less than the third thickness;
   Step 4, etching so as to remove completely the active layer film and the source/drain metal film corresponding to the photoresist-completely-removed region; ashing the photoresist so as to thin it by a thickness corresponding to the fourth thickness; and then etching so as to etch the source/drain metal film and a part of the active layer film in the channel region, and form a TFT channel; and lifting off the remained photoresist pattern, and simultaneously lifting off the gate insulating film and the photoresist above the gate line leading wire region so as to expose the gate line leading wire;
   Step 5, forming a protection layer and a pixel electrode on the base substrate after Step 4 by a patterning process.

2. The manufacturing method for the array substrate of claim 1, wherein, the step for forming the protection layer and the pixel electrode comprising:
   Step 51, depositing a transparent electrode layer on the substrate after Step 4, applying a layer of photoresist on the transparent electrode layer, and exposing and developing the photoresist with a single tone mask so as to form a photoresist pattern located above a pixel electrode region, the gate line leading wire region and the data line leading wire region;
   Step 52, etching so as to form the pixel electrode;
   Step 53, forming a protection layer film on the base substrate after the pixel electrode is formed in Step 52, and lifting off the remained photoresist and the protection film formed thereon, so as to form the protection layer.

3. The manufacturing method for the array substrate of claim 1, wherein, forming the gate metal film on the base substrate comprising:
   depositing the gate metal film with a thickness of 500 Å-4000 Å on the base substrate by a sputtering or an thermal evaporation method.

4. The manufacturing method for the array substrate of claim 2, wherein, forming the gate metal film on the base substrate comprising:
   depositing the gate metal film with a thickness of 500 Å-4000 Å on the base substrate by a sputtering or an thermal evaporation method.

5. The manufacturing method for the array substrate of claim 1, wherein, the active layer film comprises a semiconductor layer film and a doped semiconductor layer film, and sequentially depositing the gate insulating film, the active layer film and the source/drain metal film on the base substrate comprising:

sequentially depositing the gate insulating film with a thickness of 1000 Å to 6000 Å, the semiconductor layer film with a thickness of 1000 Å to 6000 Å, the doped semiconductor layer film with a thickness of 200 Å to 1000 Å by a chemical vapor deposition; and then depositing the source/drain metal film with a thickness of 1000 Å to 7000 Å by a magnetic sputtering or a thermal evaporation method.

6. The manufacturing method for the array substrate of claim 2, wherein, the active layer film comprises a semiconductor layer film and a doped semiconductor layer film, and sequentially depositing the gate insulating film, the active layer film and the source/drain metal film on the base substrate comprising:

sequentially depositing the gate insulating film with a thickness of 1000 Å to 6000 Å, the semiconductor layer film with a thickness of 1000 Å to 6000 Å, the doped semiconductor layer film with a thickness of 200 Å to 1000 Å by a chemical vapor deposition; and then depositing the source/drain metal film with a thickness of 1000 Å to 7000 Å by a magnetic sputtering or a thermal evaporation method.

7. The manufacturing method for the array substrate of claim 1, wherein, the first thickness is 0.5 to 2 μm; the second thickness is 1 to 4 μm; the third thickness is 1 to 2 μm; and the fourth thickness is 0.5 to 2 μm.

8. The manufacturing method for the array substrate of claim 2, wherein, the first thickness is 0.5 to 2 μm; the second thickness is 1 to 4 μm; the third thickness is 1 to 2 μm; and the fourth thickness is 0.5 to 2 μm.

9. The manufacturing method for the array substrate of claim 1, wherein, the part of the active layer film being etched in Step 4 comprises the doped semiconductor layer film and a part of semiconductor layer film corresponding to the channel region.

10. The manufacturing method for the array substrate of claim 2, wherein, the part of the active layer film being etched in Step 4 comprises the doped semiconductor layer film and a part of semiconductor layer film corresponding to the channel region.

11. The manufacturing method for the array substrate of claim 2, wherein, the thickness of the photoresist formed above the pixel electrode region, the gate line leading wire region and the data line leading wire region is 1 to 2 μm.

12. The manufacturing method for the array substrate of claim 2, wherein, forming the protection film on the base substrate comprising:

depositing the protection film with a thickness of 1000 Å to 6000 Å on the base substrate by a chemical vapor deposition.

* * * * *